(12) United States Patent
Becker et al.

(10) Patent No.: US 8,690,629 B2
(45) Date of Patent: Apr. 8, 2014

(54) LUMINESCENCE CONVERSION LED

(75) Inventors: Daniel Becker, Augsburg (DE); Herbert Brunner, Sinzing (DE); Tim Fiedler, München (DE); Jörg Strauβ, Regensburg (DE); Martin Zachau, Geltendorf (DE)

(73) Assignee: OSRAM Gesellschaft mit beschrankter Haftung, Munich (DE)

( * ) Notice: Subject to any disclaimer, the term of this patent is extended or adjusted under 35 U.S.C. 154(b) by 0 days.

(21) Appl. No.: 13/033,370

(22) Filed: Feb. 23, 2011

(65) Prior Publication Data

US 2011/0143627 A1 Jun. 16, 2011

Related U.S. Application Data

(62) Division of application No. 11/920,757, filed on Nov. 19, 2007, now abandoned.

(30) Foreign Application Priority Data

May 19, 2005 (DE) .......................... 10 2005 023 134

(51) Int. Cl.
*H01J 9/22* (2006.01)

(52) U.S. Cl.
USPC .. 445/58; 257/98; 257/E33.059; 257/E33.061

(58) Field of Classification Search
USPC ............... 445/58; 257/98, E33.059, E33.061, 257/E33.067
See application file for complete search history.

(56) References Cited

U.S. PATENT DOCUMENTS

| 5,998,925 | A | 12/1999 | Shimizu et al. |
| 6,417,019 | B1 | 7/2002 | Mueller et al. |
| 6,504,181 | B2 | 1/2003 | Furukawa et al. |
| 6,734,465 | B1 | 5/2004 | Taskar et al. |
| 2002/0180351 | A1 | 12/2002 | McNulty et al. |
| 2003/0025449 | A1 | 2/2003 | Rossner |
| 2003/0227249 | A1 | 12/2003 | Mueller et al. |
| 2004/0212302 | A1 | 10/2004 | Letz et al. |

FOREIGN PATENT DOCUMENTS

| EP | 1 369 935 | 12/2003 |
| EP | 1 605 526 | 12/2005 |
| JP | 06324204 | 11/1994 |
| JP | 08-162676 | 6/1996 |
| JP | 09175831 | 7/1997 |
| JP | 11177129 | 7/1999 |

(Continued)

OTHER PUBLICATIONS

S. Tanabe, et al. "Glass Ceramic Phosphors for Solid State Lighting", 79 Glastechnische Tagung Würzburg, pp. 32-39 May 2005.

(Continued)

*Primary Examiner* — Anh Mai
*Assistant Examiner* — Elmito Breval
(74) *Attorney, Agent, or Firm* — Cozen O'Connor

(57) ABSTRACT

A luminescence conversion LED having a radiation emitting chip that is connected to electrical connections and is surrounded by a housing that comprises at least a basic body and a cap, the chip being seated on the basic body, in particular in a cutout of the basic body, and the primary radiation of the chip being converted at least partially into longer wave radiation by a conversion element, wherein the cap is formed by a vitreous body, the conversion means being contained in the vitreous body, the refractive index of the vitreous body being higher than 1.6, preferably at least n=1.7.

9 Claims, 2 Drawing Sheets

(56) References Cited

FOREIGN PATENT DOCUMENTS

| | | |
|---|---|---|
| JP | 11-293420 | 10/1999 |
| JP | 2000-026133 | 1/2000 |
| JP | 2000211942 | 8/2000 |
| JP | 2002004880 | 1/2002 |
| JP | 2002-141556 | 5/2002 |
| JP | 2002141556 | 5/2002 |
| JP | 3091911 | 11/2002 |
| JP | 2002353516 | 12/2002 |
| JP | 2003101115 | 4/2003 |
| JP | 2003243726 | 8/2003 |
| JP | 2003-258308 | 9/2003 |
| JP | 2004-015063 | 1/2004 |
| JP | 2004-046031 | 2/2004 |
| JP | 2004-152993 | 5/2004 |
| JP | 2004273798 | 9/2004 |
| JP | 2005-79540 | 3/2005 |
| JP | 2005072129 | 3/2005 |
| JP | 2002201041 | 7/2006 |
| TW | 466787 | 12/2001 |

OTHER PUBLICATIONS

German translation of Japanese Office Action dated Aug. 25, 2011 in corresponding Japanese Patent Application No. 2008-511544.

English Translation of an Office Action dated Jul. 27, 2012 issued in the corresponding Taiwanese Patent Application No. 95117467.

LUMINESCENCE CONVERSION LED

CROSS REFERENCE TO RELATED APPLICATIONS

This application is a Divisional of U.S. patent application Ser. No. 11/920,757 which was filed with the U.S. Patent and Trademark Office on Nov. 19, 2007 now abandoned. This application claims the priority of German patent application no. 10 2005 023 134.9 filed May 19, 2005, the content of which is hereby incorporated by reference.

BACKGROUND OF THE INVENTION

1. Field of the Invention

The present invention relates to a luminescence conversion LED and, in particular, an LED with a high efficiency of conversion.

2. Description of the Related Art

US-A 2003/025449 has already disclosed a luminescence conversion LED in which the phosphor is embedded in an environment made from glass containing material. This exhibits higher stability than the usual resins or silicones, above all in the case of chips that emit shortwave primary radiation in the UV or blue spectral region. Glass, glass ceramic or silica glass is to be regarded as suitable in this case.

U.S. Pat. No. 6,417,019 discloses converting the phosphor by the use of an environment with as high a refractive index as possible, namely of at least 1.5, preferably more than 2.1. However, no particular implementation is specified therefor.

SUMMARY OF THE INVENTION

It is an object of the present invention to provide a luminescence conversion LED that has a high conversion efficiency.

This and other objects are attained in accordance with one aspect of the invention directed to a luminescence conversion LED having a radiation emitting chip that is connected to electrical connections and is surrounded by a housing that comprises at least a basic body and a cap, the chip being seated on the basic body, in particular in a cutout of the basic body, and the primary radiation of the chip being converted at least partially into longer wave radiation by a conversion element, wherein the cap is formed by a vitreous body, the conversion means being contained in the vitreous body, the refractive index of the vitreous body being higher than 1.6, preferably at least n=1.7.

The present invention is based on the idea of minimizing the losses in the LED through jumps in the refractive index of the various materials. The phosphors are usually embedded in a cladding material. Primary and secondary radiation is scattered on the powder particles of the phosphor, and this leads to scattering losses. This cladding material also surrounds the chip and constitutes an optical path for coupling of the light beam from the LED. Known cladding materials are epoxy resins, silicones and hybrids of these material classes. The refractive index of these materials, and also of conventional glass materials, is typically at n=1.4 to 1.6.

By making targeted use of glasses with as high a refractive index as possible of more than 1.6, preferably at least n=1.7, it is possible to reduce the losses attending them. Furthermore, it is advantageous that the material exhibits good transparency in the range of 400 to 750 nm.

In order to minimize the losses owing to jumps in refractive index and scattering at the phosphor, the refractive index of the glass should, on the one hand, come as close as possible to that of the phosphor. On the other hand, in order to maximize the exit efficiency of the blue light from the semiconductor chip into a glass/phosphor converter composition, the refractive index of this converter should come as close as possible to that of the semiconductor chip. In the exemplary case of the phosphor YAG:Ce and a blue emitting semiconductor LED of type InGaN, the refractive indices are approximately n=1.8 and n=2.2.

A further boundary condition is, of course, that the emission wavelength of the chip is suitable for exciting the phosphor to emission, and that the cladding material and this primary emission, as well as the secondary emission of the phosphors absorb as little as possible.

Consequently, it is a basic requirement to clad the phosphor with high index glass. Many phosphors have a refractive index of from 1.7 to more than 2. In these cases, the phosphor is to be embedded in a medium with as high an index as possible. Losses owing to scattering and jumps in refractive index at the particles of the phosphor and total reflection, and therefore higher losses owing to absorption, can thereby be minimized in the phosphor particles.

A further advantage of glasses as against the known cladding materials such as epoxy resins, silicones or hybrids of these two material classes is their higher resistance to heat, something which is chiefly important for so called high power LEDs with "junction" temperatures substantially above 140° C.

Garnet phosphors, above all, are suitable for such a mode of procedure: firstly, because they have a high refractive index (about n=2) in any case, and secondly because they are stable against relatively high processing temperatures such as can occur during embedding in glass. Again, a few oxinitride phosphors are particularly well suited therefor.

The use of a glass matrix in conjunction with nanophosphors is particularly advantageous, since the transparency of the glass is maintained in this case completely or at least to a large extent. Nanophosphors are phosphors with a mean particle size of clearly below 1 µM, particularly between 10 and 500 nm.

The phosphor can be enclosed in particle form by glass, and subsequently dispersed in a glass or polymer. However, the phosphor can also be dispersed directly in the glass and subsequently be brought into the desired form by shaping. The phosphor particles can also be synthesized directly in the glass melt. If appropriate, it is also advantageous to machine the surfaces after this, for example by polishing, in order to obtain desired surfaces or shapes. Dispersion of the phosphor particles in a glass is performed, for example, by heating a mixture of phosphor and ground glass powder. Melting is performed, for example, in a crucible of Pt in a muffle furnace up to a temperature at which a vitreous body is produced. Subsequently, the crucible is quenched in a water bath, and the cooled glass body is removed from the crucible. In this case, a transparent, vitreous body is produced only starting from a specific temperature, to be precise, not until the glass component has partially melted.

Various methods are possible for producing the phosphor glass composition converter:

1st method: Sintering a mixture of phosphor and glass powder, and optionally further additives for the more effective dispersion of the phosphor particles, to a temperature in the vicinity of the softening point of the glass. In particular, the mixture can be previously pressed in order to minimize air inclusions. It is possible with the aid of this method to achieve a relatively homogeneous distribution of the phosphor in the glass as long as the temperature is not so high that reaction occurs between phosphor particles and glass and the viscosity of the glass drops sharply and the phosphor sediments in the glass. The rate of cooling will depend on the type of glass and can, if appropriate, take place quickly in order to avoid crystallization of the glass. For cooling purposes, the glass can be cast into a mold and optionally be pressed immediately or subsequently. This method can be effectively used in order to simultaneously impart optical properties. A lens can be formed, for example. As a general rule, in this case an agglomeration of the phosphor particles is reliably avoided. The phosphor particles are tightly enclosed by glass in this method.

2nd method: Spraying a liquid melt made from glass or suitable precursor materials with phosphor powder suspended therein. In the event of spraying and expansion caused thereby, cooling occurs immediately and phosphor grains enclosed by a glass cladding are formed. These can subsequently be sintered to form a compact vitreous body.

3rd method: Producing a layer of defined thickness from phosphor, and optionally glass powder as well as binder and other additives on a glass substrate, with subsequent sintering at a temperature at which no chemical reactions yet occur between glass material and phosphor. A thin layer is formed in this case in which the phosphor grains are tightly enclosed by a glass matrix. The above steps can be repeated until the desired layer thickness is achieved. In particular, it is possible to use a specifically shaped, for example plane, and even polished substrate. This method has the advantage that the shape of the converter, in particular the planarity, can be largely defined before the introduction of the phosphor, because it is scarcely influenced by the introduction of the phosphor. It follows that cost effective standard substrates, or at least standard shaping techniques, can be used. A further advantage is that the phosphor penetrates into the substrate only on one side, and so the averted side remains largely undisturbed and largely retains its original properties, in particular the higher mechanical stability of a glass substrate without inclusions. A glass/phosphor layer can advantageously be sintered on a glass substrate by supplying energy on one side. In addition to conventional heating methods, this purpose is also served by electromagnetic irradiation. In particular, one sided heating by means of a laser (for example $CO_2$ laser) or a microwave transmitter are on offer.

4th method: Applying a phosphor layer to a substrate, preferably directly to the semiconductor substrate, and depositing glass or suitable glass precursors from the gas phase into the interspaces between the phosphor grains. The production of glass from the gas phase is known per se.

5th method: The synthesis of the phosphor particles is performed in the glass melt. The precipitation of YAG:Ce crystals from a $Y_2O_3$—$Al_2O_3$—$SiO_2$—$CeO_2$ glass melt is known, see S. Tanabe (Graduate School of Human and Environmental Sciences, Kyoto University, Kyoto, Japan): "Glass ceramic phosphors for solid-state lighting", 79th Glass Conference, Würzburg, May 2005. This method can be used with particular advantage to produce phosphor particles in the nanometer and submicrometer range that are dispersed in glass, since the agglomeration of these phosphor particles is effectively prevented.

Glasses with a high refractive index of typically 1.6, in particular 1.7 or more, are fundamentally suitable. Particularly suitable are barite crown glasses, lanthanum crown glass and dense flint glasses. A high refractive index is achieved by the inclusion of specific ions, $Pb^{2+}$, $Bi^{3+}$, $Ba^{2+}$, $Li^+$ and $Ti^{4+}$ being particularly suitable.

The advantage of Pb is, for example, the low processing temperature and the low tendency to devitrification. A typical lead glass is 15-30% PbO, 3 to 7% Na2O and/or K2O, residue SiO2. These glasses have a low softening point (approximately 300 to 500° C.), a high coefficient of thermal expansion, a high refractive index of approximately n=1.8 and a good transparency in the range of 300 to 3000 nm. A typical processing temperature here is 720 to 880° C.

In the case of the class of high index glasses that do not contain lead, bismuth-containing borate glasses and phosphate glasses, in particular, prove to be suitable, in addition to a low processing temperature these also have high refractive indices in the region of 2.0 to 2.3.

Finally, such glasses, in particular, can themselves be especially well shaped directly to the production of optical properties, for example as dome with lens properties.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The aim below is to explain the invention in more detail with the aid of a number of exemplary embodiments. In the drawings.

DETAILED DESCRIPTION OF THE PREFERRED EMBODIMENTS

Figure 1:
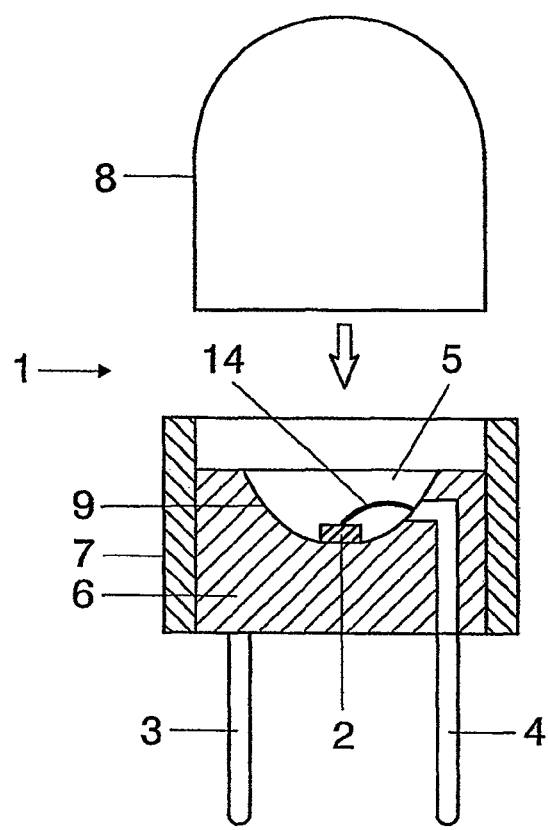
FIG. 1 shows a semiconductor component that serves as light source (LED) for white light.

A design such as is described in U.S. Pat. No. 5,998,925, for example, is employed for use in a white LED together with an InGaN Chip. The design of such a light source for white light is shown explicitly in FIG. 1. The light source is a semiconductor component (chip 1) of type InGaN with a peak emission wavelength of 460 nm and having a first and second electrical connection 2, 3 that is embedded in an opaque basic housing 8 in the region of a cutout 9. One of the connections 3 is connected to the chip 1 via a bonding wire 14. The cutout has a wall 17 that serves as reflector for the blue primary radiation of the chip 1. The cutout 9 is filled with a casting compound 5 that contains the components of glass and phosphor pigments 6. The phosphor pigments are, for example, a mixture of a number of pigments, including YAG:Ce. An alternative is TbAG:Ce. Production takes place according to one of methods 1 and 2.

Figure 2:
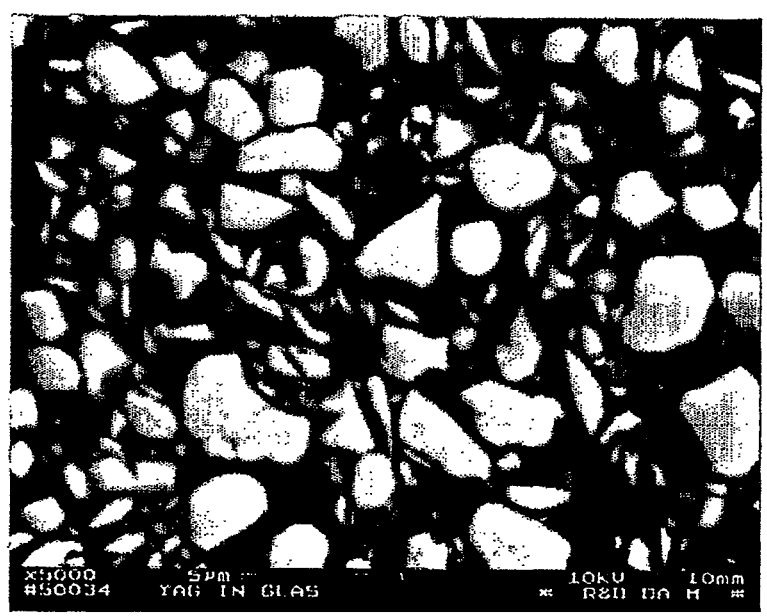
FIG. 2 shows an REM picture of a phosphor glass composition produced according to method 1.

The REM picture in FIG. 2 shows a cross section of a solid phosphor glass composition. The production took place according to method 1, more precisely by intensive mixing of glass powder and phosphor powder and subsequent sintering at 1000° C. for 1 h.

The REM picture shows, firstly, that the garnet phosphor grains are tightly coated with glass without air gaps and that, secondly, it is possible to achieve a high density of YAG particles in glass without dissolving the YAG particles in the glass, and that this is possible for phosphor grains of the most varied shape and grain size. However, the image is only an example and does not in any way constitute a restriction with regard to the density of the YAG particles in the glass, the grain size, the grain distribution or the grain shape of the phosphor particles. These are generally freely selectable and can be optimized as a function of design.

Figure 3:
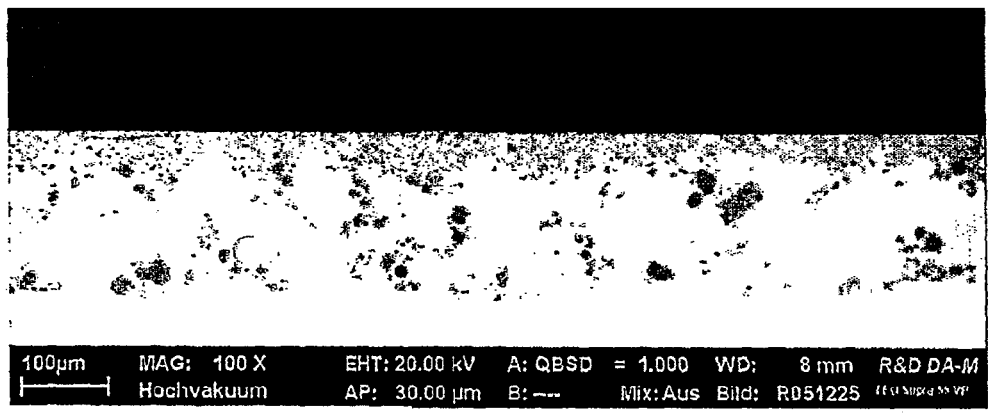
FIG. 3 an REM picture of a phosphor glass composition produced according to method 3.

The REM picture of FIG. 3 shows a phosphor glass composition converter that is produced using method 3. It is to be seen that this method can be used to produce very thin layers with a high phosphor content. Here, as well, the phosphor grains are tightly coated with glass without an air gap. In particular, no air bubbles are enclosed in the glass.

Figure 4:
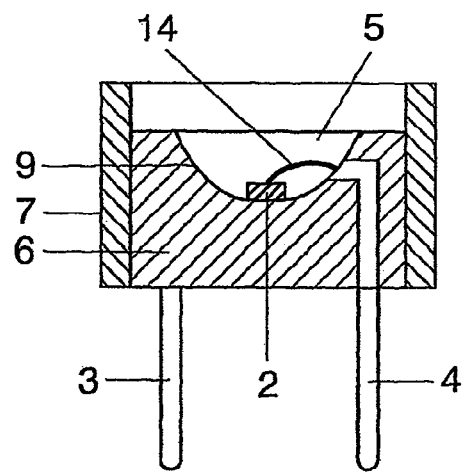
FIG. 4 shows a further exemplary embodiment of an LED.

A further embodiment is an LED in the case of which a suitably prepared glass plate is arranged upstream of the chip. In FIG. 4, the light source is a semiconductor component (chip 1) of type InGaN with a peak emission wavelength of 460 nm and having a first and second electrical connection 2, 3 that is embedded in an opaque basic housing 8 in the region of a cutout 9. One of the connections 3 is connected to the chip 1 via a bonding wire 14. The cutout has a wall 17 that serves as reflector for the blue primary radiation of the chip 1. The cutout 9 is filled with a casting compound 5 that contains immersion liquid as main component. Arranged upstream thereof is a glass plate 8 that is prepared on its underside with pigments, including YAG:Ce, according to one of methods 3 and 4.

High index glasses with a low softening temperature and relatively slight change in viscosity with the temperature at the softening point are to be preferred as matrix. Starting from a specific temperature, the phosphor layer diffuses into the glass plate and can no longer be removed mechanically.

In order to avoid the inclusion of air bubbles, it is advantageous to subject the glass powder to a heat treatment before it is processed. One alternative is to raise the melting process to temperatures of at least 1200° C. A temperature of 1400 to 1500° C. is recommended for very good homogenization. Typical homogenizing and refining methods are thermal refining: raising the temperature as far as 1590° C.;
mechanical stirring or ultrasound;
introducing additional gases into the bottom of the trough; and
chemically refining by deliberately producing large gas bubbles; a typically refining agent is $Na_2SO_4$ in this case; here, a temperature of at least 1300° C. is to be approached. In general, the aim should be always to apply the method requiring as little an increase in temperature as possible.

Examples of particularly suitable glasses are lanthanum crown, lanthanum heavy flint, barite heavy flint and, in particular, lanthanum flint and barite flint.

The following table 1 shows two particular examples. The composition is specified in percent.

A first exemplary embodiment is as follows: a YAG:Ce powder ($d_{50}$ approximately 2 μm) and Schott 8532 glass powder are mixed at a mass ratio of 1:3 in a centrifugal rotary mixer at 3000 rpm. The mixture is heated for 30 min in a platinum crucible at 780° C. in air and then quenched in a water bath to room temperature. A glass body with a yellow body color is formed. Its surface is ground flat.

A second exemplary embodiment is as follows: a YAG:CE powder ($d_{50}$ approximately 2 μm) and a bismuth-borate glass powder (30% $Bi_2O_3$) are mixed at a mass ratio of 1:3 in a centrifugal rotary mixer at 3000 rpm. The mixture is heated at 700° C. in a platinum crucible for 30 min and then quenched in a water bath to room temperature. Its surface is ground flat.

A third exemplary embodiment YAG:Ce powder ($d_{50}$ approximately 6 μm) and Schott 8532 glass powder are mixed at a mass ratio of 1:3 in a centrifugal rotary mixer at 2700 rpm. The mixture is slurried in ethanol. Consequently, a thin, flat glass plate of Schott 8532 glass is coated. The ethanol is vaporized to air at 50° C. The coated glass plate is heated in a Pt crucible at 780° C. for 30 min and subsequently cooled slowly to room temperature. An REM picture of the cross section is to be seen in FIG. 3.

TABLE 1

| Component | Boron crown glass | Lanthanum crown glass |
|---|---|---|
| $SiO_2$ | 65-75 | — |
| $B_2O_3$ | 5-11 | 34-41 |
| $K_2O$ | 16-23 | — |
| CaO | 1.5-3.8 | — |
| BaO | — | 11.5-16 |
| $Al_2O_3$ | 1.6-3.5 | — |
| SrO | — | 3.9-8.2 |
| $La_2O_3$ | — | 15-32 |
| $ThO_2$ | — | 5-25 |
| Refractive index at 590 nm | 1.7-1.75 | 1.7-1.85 |

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A method for producing a luminescence conversion LED having a radiation emitting chip that is connected to electrical connections and is surrounded by a housing that comprises at least a basic body and a glass substrate, the chip being seated on the basic body, and the primary radiation of the chip being converted at least partially into longer wave radiation by a conversion element, wherein the conversion element is contained in the vitreous body, the refractive index of the vitreous body is higher than 1.6, said method comprising:
sintering a mixture of phosphor and glass powder to a temperature in the vicinity of the softening point of the glass such that the phosphor penetrates the glass substrate only from one side;
forming the vitreous body based on the group consisting of crown glass, flint glass, bismuth containing borate glass, phosphate glass, and a glass whose main component is $Al_2O_3$; and
wherein the glass substrate is formed by the vitreous body.

2. The method of claim 1 wherein the mixture of phosphor and glass powder is pressed so as to minimize air inclusion.

3. A method for producing a luminescence conversion LED having a radiation emitting chip that is connected to electrical connections and is surrounded by a housing that comprises at least a basic body and a glass substrate, the chip being seated on the basic body, and the primary radiation of the chip being converted at least partially into longer wave radiation by a conversion element, wherein the conversion element is contained in the vitreous body, the refractive index of the vitreous body is higher than 1.6, said method comprising:
- producing a liquid melt from glass, or suitable precursor materials with phosphor powder suspended therein;
- spraying the liquid melt;
- temperature treatment near the softening point of the glass material such that the phosphor penetrates the glass substrate only from one side;
- forming the vitreous body based on the group consisting of crown glass, flint glass, bismuth containing borate glass, phosphate glass, and a glass whose main component is $Al_2O_3$; and
- wherein the glass substrate is formed by the vitreous body.

4. A method for producing a luminescence conversion LED having a radiation emitting chip that is connected to electrical connections and is surrounded by a housing that comprises at least a basic body and a glass substrate, the chip being seated on the basic body, and the primary radiation of the chip being converted at least partially into longer wave radiation by a conversion element, wherein the conversion element is contained in the vitreous body, the refractive index of the vitreous body is higher than 1.6, said method comprising:
- applying a phosphor layer made from particles to the glass substrate;
- depositing glass or glass precursors from the gas phase into the interspaces between the phosphor grains;
- temperature treatment near the softening point of the glass material such that the phosphor penetrates the glass substrate only from one side;
- forming the vitreous body based on the group consisting of crown glass, flint glass, bismuth containing borate glass, phosphate glass, and a glass whose main component is $Al_2O_3$; and
- wherein the glass substrate is formed by the vitreous body.

5. The method of claim 4 wherein the phosphor layer is directly applied to a chip.

6. A method for producing a luminescence conversion LED having a radiation emitting chip that is connected to electrical connections and is surrounded by a housing that comprises at least a basic body and a glass substrate, the chip being seated on the basic body, and the primary radiation of the chip being converted at least partially into longer wave radiation by a conversion element, wherein the conversion element is contained in the vitreous body, the refractive index of the vitreous body is higher than 1.6, said method comprising:
- producing a liquid melt from glass;
- precipitating phosphor particles from the glass melt;
- temperature treatment near the softening point of the glass material such that the phosphor penetrates the glass substrate only from one side;
- forming the vitreous body based on the group consisting of crown glass, flint glass, bismuth containing borate glass, phosphate glass, and a glass whose main component is $Al_2O_3$; and
- wherein the glass substrate is formed by the vitreous body.

7. A method for producing a luminescence conversion LED having a radiation emitting chip that is connected to electrical connections and is surrounded by a housing that comprises at least a basic body and a glass substrate, the chip being seated on the basic body, and the primary radiation of the chip being converted at least partially into longer wave radiation by a conversion element, wherein the conversion element is contained in the vitreous body, the refractive index of the vitreous body is higher than 1.6, said method comprising:
- a) producing a layer of defined thickness from phosphor on the glass substrate;
- b) optionally repeating step a) until the desired layer thickness is achieved;
- c) temperature treatment near the softening point of the glass material such that the phosphor penetrates the glass substrate only from one side;
- d) forming the vitreous body based on the group consisting of crown glass, flint glass, bismuth containing borate glass, phosphate glass, and a glass whose main component is $Al_2O_3$; and
- wherein the glass substrate is formed by the vitreous body.

8. The method of claim 7 further comprising a binder and other additives on the glass substrate.

9. The method of claim 7 further comprising a binder and other additives on the glass substrate.

* * * * *